(12) United States Patent
Nakabo et al.

(10) Patent No.: US 7,466,192 B2
(45) Date of Patent: Dec. 16, 2008

(54) LOW-PASS FILTER AND VOLTAGE-CURRENT CONVERSION CIRCUIT USED IN THE SAME

(75) Inventors: Masatoshi Nakabo, Neyagawa (JP); Mamoru Sekiya, Neyagawa (JP); Masaaki Inoue, Neyagawa (JP)

(73) Assignee: Onkyo Corporation, Neyagawa (JP)

( * ) Notice: Subject to any disclaimer, the term of this patent is extended or adjusted under 35 U.S.C. 154(b) by 14 days.

(21) Appl. No.: 11/739,826

(22) Filed: Apr. 25, 2007

(65) Prior Publication Data

US 2008/0062023 A1      Mar. 13, 2008

(30) Foreign Application Priority Data

Sep. 7, 2006    (JP) .............................. 2006-242667

(51) Int. Cl.
*H03B 1/00* (2006.01)
(52) U.S. Cl. ....................................... 327/558; 327/103
(58) Field of Classification Search ................. 327/103, 327/551, 552, 558
See application file for complete search history.

(56) References Cited

U.S. PATENT DOCUMENTS

| | | |
|---|---|---|
| 5,094,333 A | 3/1992 | Mimura |
| 5,627,494 A | 5/1997 | Somerville |
| 6,008,632 A * | 12/1999 | Sasaki ........................ 323/313 |
| 6,697,002 B2 | 2/2004 | Sekiya et al. |
| 6,791,397 B2 * | 9/2004 | Shimozono ................. 327/543 |

FOREIGN PATENT DOCUMENTS

| | | |
|---|---|---|
| JP | 03-239823 | 10/1991 |
| JP | 09-162652 | 6/1997 |
| JP | 11-186859 | 7/1999 |
| JP | 2000-269752 | 9/2000 |
| JP | 2003-283299 | 10/2003 |
| JP | 2005-051854 | 2/2005 |

* cited by examiner

*Primary Examiner*—Jeffrey S Zweizig
(74) *Attorney, Agent, or Firm*—Renner, Otto, Boisselle & Sklar, LLP

(57) ABSTRACT

A low-pass filter with a high signal-to-noise ratio is provided. A low-pass filter includes a first RC filter circuit, a differential operation circuit subtracting an output signal from a low frequency component of an input signal and outputting a differential signal, a second RC filter circuit, a voltage-current conversion circuit, and a capacitor. The voltage-current conversion circuit includes an operational amplifier, a first resistor, and a feedback circuit generating a feedback voltage in accordance with a voltage applied to the first resistor. If resistance values of first to fourth resistors are $R_1$, $R_2$, $R_3$, $R_4$, a relational expression of $R_1 * R_3 = R_2 * R_4$ is satisfied, and output current i becomes constant regardless of a resistance value of a load resistance. Since only a first resistor is connected between the input and the output of the voltage-current conversion circuit, thermal noise decreases, and a signal-to-noise ratio becomes high.

7 Claims, 1 Drawing Sheet

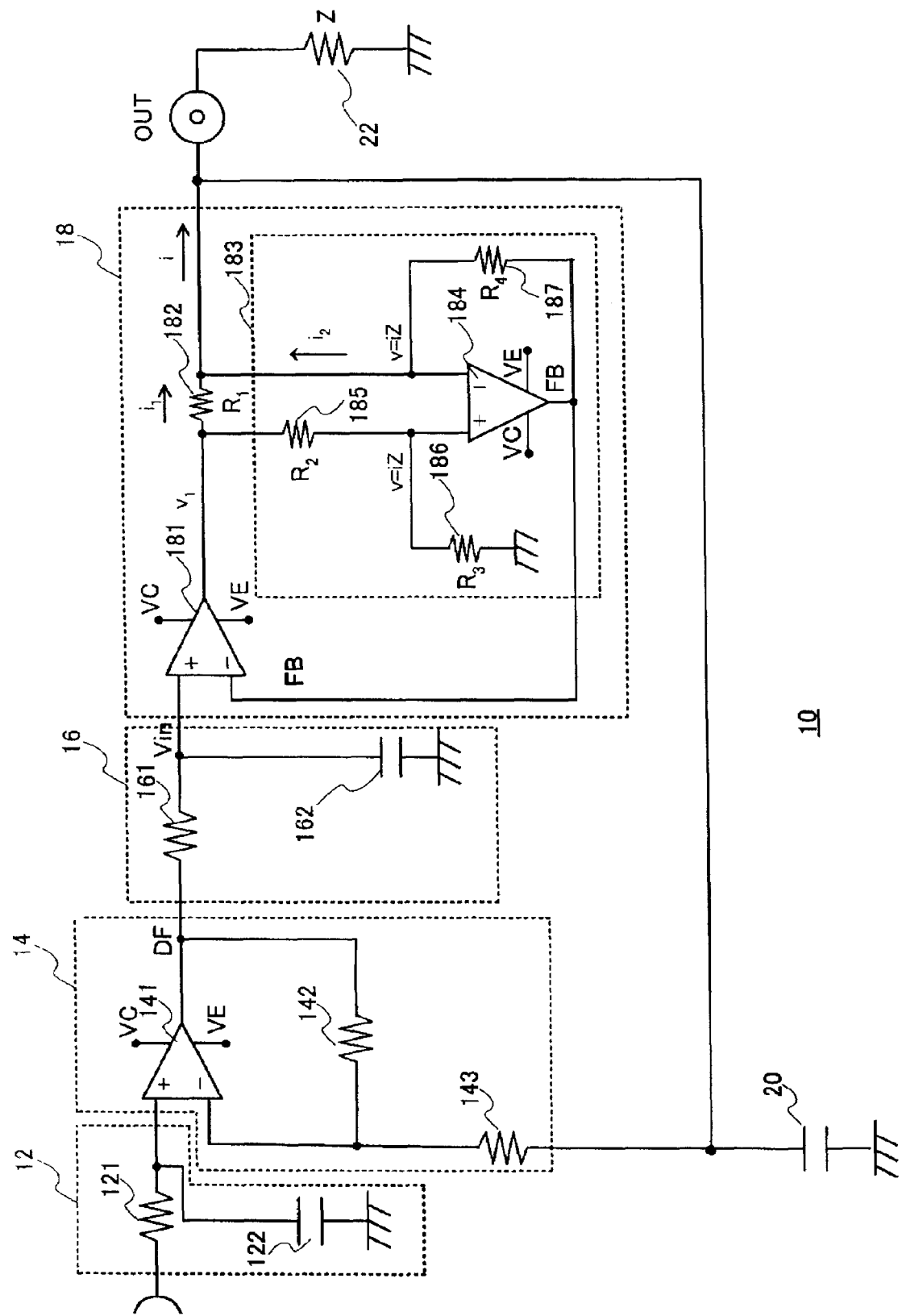

LOW-PASS FILTER AND VOLTAGE-CURRENT CONVERSION CIRCUIT USED IN THE SAME

BACKGROUND OF THE INVENTION

1. Field of the Invention

The present invention relates to a low-pass filter and a voltage-current conversion circuit used in the same, and more particularly to a low-pass filter inserted into D/A (Digital to Analog) converted output of an audio apparatus.

2. Description of the Related Art

In recent years, an audio signal has been changed from the analog form to the digital form. In an output circuit, however, the signal is changed from a digital audio signal to an analog audio signal by a D/A converter. A large amount of pulse noise generated during the D/A conversion is included in the analog audio signal, and in order to remove this, a circuit called VLSC (Vector Linear Shaping Circuitry) (registered trademark of Onkyo Corporation) is provided.

A low-pass filter used in the VLSC is disclosed in Japanese Unexamined Patent Publication No. 2003-283299 (Document 1). In this low-pass filter, a voltage-current conversion circuit is used (refer to FIG. 2 of Document 1), wherein four resistors (R31 to R34 in FIG. 2 of Document 1) are connected between input and output thereof. Therefore, an increase in a combined resistance value of these resistors is unavoidable (about 50 kΩ in a circuit for practical use), and thermal noise increases, thereby reducing a signal-to-noise ratio (S/N).

SUMMARY OF THE INVENTION

An object of the present invention is to provide a low-pass filter with a high signal-to-noise ratio.

A low-pass filter according to the present invention attenuates a high frequency component of an input signal and outputs a low frequency component of the input signal as an output signal, comprising a differential operation circuit, a voltage-current conversion circuit, and a capacitance. The differential operation circuit subtracts the output signal from the input signal, and outputs a differential signal. The voltage-current conversion circuit converts a voltage of the differential signal outputted from the differential operation circuit into a current. The capacitance accumulates charges in a current received from the voltage-current conversion circuit to generate the output signal. The voltage-current conversion circuit includes a first operational amplifier, a first resistor, and a feedback unit. The first operational amplifier has a noninverting input terminal connected to an input terminal of the voltage-current conversion circuit and an inverting input terminal receiving a feedback voltage. The first resistor is connected between an output terminal of the voltage-current conversion circuit and an output terminal of the first operational amplifier. The feedback unit generates a feedback voltage in accordance with a voltage applied to the first resistor.

According to this low-pass filter, since only the first resistor is connected between the input and the output of the voltage-current conversion circuit (about 1 kΩ in a circuit in practical use), thermal noise decreases, and thus a signal-to-noise ratio becomes high.

Preferably, the feedback unit includes a second operational amplifier, a second resistor, a third resistor, and a fourth resistor. The second operational amplifier has an inverting input terminal connected to the output terminal of the voltage-current conversion circuit and an output terminal connected to the inverting input terminal of the first operational amplifier. The second resistor is connected between the output terminal of the first operational amplifier and a noninverting input terminal of the second operational amplifier. The third resistor is connected between the noninverting input terminal of the second operational amplifier and a ground. The fourth resistor is connected between the output terminal of the second operational amplifier and the inverting input terminal of the second operational amplifier.

Preferably, resistance values $R_1$ to $R_4$ of the first to fourth resistors are set so as to satisfy a relational expression of $R_1*R_3=R_2*R_4$. In this case, the output current of the voltage-current conversion circuit is proportional to the input voltage regardless of a value of a load resistance connected to the low-pass filter.

BRIEF DESCRIPTION OF THE DRAWING

The FIGURE is a circuit diagram showing a configuration of a low-pass filter according to an embodiment of the present invention.

DESCRIPTION OF THE PREFERRED EMBODIMENT

An embodiment of the present invention is described in detail hereinafter with reference to the drawing. The same or equivalent parts in FIGURES are denoted by the same reference numerals, and their descriptions are not repeated.

Referring to the FIGURE, a low-pass filter 10 according to an embodiment of the present invention includes an RC filter circuit 12, a differential operation circuit 14, and an RC filter circuit 16, a voltage-current conversion circuit 18, and a capacitor 20. The RC filter circuit 12 is a low-pass filter including a resistor 121 and a capacitor 122, and attenuates a high frequency component of an input signal IN and outputs a low frequency component thereof to the differential operation circuit 14. The differential operation circuit 14 includes an operational amplifier 141, and resistors 142 and 143, and subtracts an output signal OUT from (a low frequency component of) the input signal IN and outputs a differential signal DF to the RC filter circuit 16. The RC filter circuit 16 is a low-pass filter including a resistor 161 and a capacitor 162, and attenuates a high frequency component of the differential signal DF outputted from the differential operation circuit 14, and outputs a low frequency component thereof to the voltage-current conversion circuit 18. The capacitor 20 receives a current outputted from the voltage-current conversion circuit 18 and accumulates charges to thereby generate the output signal OUT.

The voltage-current conversion circuit 18 includes an operational amplifier 181, a resistor 182, and a feedback circuit 183. The operational amplifier 181 has a noninverting input terminal (+) connected to an input terminal of the voltage-current conversion circuit 18 and an inverting input terminal (−) receiving a feedback voltage FB. The resistor 182 is connected between an output terminal of the voltage-current conversion circuit 18 and an output terminal of the operational amplifier 181. The feedback circuit 183 generates a feedback voltage FB in accordance with a voltage applied to the resistor 182.

The feedback circuit 183, more specifically, includes an operational amplifier 184, and resistors 185 to 187. The operational amplifier 184 has an inverting input terminal (−) connected to the output terminal of the voltage-current conversion circuit 18, and an output terminal connected to the inverting input terminal (−) of the operational amplifier 181. The resistor 185 is connected between the output terminal of the operational amplifier 181 and a noninverting input terminal (+) of the operational amplifier 184. The resistor 186 is connected between the noninverting input terminal (+) of the operational amplifier 184 and a ground. The resistor 187 is connected between the output terminal of the operational amplifier 184 and the inverting input terminal (−) of the operational amplifier 184.

If resistance values of the resistors 182, 185, 186, 187 are $R_1$, $R_2$, $R_3$, $R_4$, respectively, and a resistance value of a load resistance 22 is Z, the following four equations (1) to (4) are established in the voltage-current conversion circuit 18:

$$i_2 \cdot R_4 = v_{in} - i \cdot Z \tag{1}$$

$$i_1 \cdot R_1 = v_1 - i \cdot Z \tag{2}$$

$$v_1 = i \cdot Z \cdot \frac{R_2 + R_3}{R_3} \tag{3}$$

$$i = i_1 + i_2 \tag{4}$$

If equation (1) is expanded with respect to $i_2$, $i_2$ is represented by the following equation (5):

$$i_2 = \frac{v_{in} - i \cdot Z}{R_4} \tag{5}$$

If equation (2) is expanded with respect to $i_1$, and equation (3) is substituted, $i_1$ is represented by the following equation (6):

$$i_1 = \frac{v_1 - i \cdot Z}{R_1}$$
$$= \frac{1}{R_1}\left(i \cdot Z \cdot \frac{R_2 + R_3}{R_3} - i \cdot Z\right) \tag{6}$$
$$= \frac{i \cdot Z \cdot R_2}{R_1 \cdot R_3}$$

If equations (5) and (6) are substituted for equation (4), i is represented by the following equation (7):

$$i = \frac{i \cdot Z \cdot R_2}{R_1 \cdot R_3} + \frac{v_{in} - i \cdot Z}{R_4} \tag{7}$$
$$= \frac{v_{in}}{R_4\left\{1 + \frac{Z}{R_1 \cdot R_3 \cdot R_4}\cdot(R_1 \cdot R_3 - R_2 \cdot R_4)\right\}}$$

In this case, if $R_1$, $R_2$, $R_3$, $R_4$ are set so as to satisfy a relational expression "$R_1 * R_3 = R_2 * R_4$", a term of Z is removed, and i is represented by the following equation (8).

$$i = \frac{v_{in}}{R_4} \tag{8}$$

As is clear from equation (8), the voltage-current conversion circuit 18 can supply an output current i proportional to an input voltage $v_{in}$. Accordingly, as long as the input voltage $v_{in}$ is constant, the output current i is constant regardless of the resistance value Z of the load resistance 22. For example, if setting of $R_1$=1 k, $R_2$=1.5 k, $R_3$=2.7 k, $R_4$=1.8 k is made, the relational expression of $R_1 * R_3 = R_2 * R_4$ is established.

If equation (8) is substituted for equation (5), $i_2$ is represented by the following equation (9).

$$i_2 = \frac{v_{in} - i \cdot Z}{R_4} \tag{9}$$
$$= \frac{i \cdot R_4 - i \cdot Z}{R_4}$$
$$= \frac{i}{R_4}(R_4 - Z)$$

As is clear from equation (9), if Z>$R_4$, $i_2$ <0 is given, and $i_2$ flows in an opposite direction of a direction shown in the FIGURE, so that $i_1$>i needs to be satisfied. Accordingly, in this case, when it is desired that an output impedance of the voltage-current conversion circuit 18 is low and that a signal-to-noise ratio is high, $i_1$ needs to be assured sufficiently.

According to the low-pass filter 10, since only one resistor, that is, the resistor 182 is connected between the input and the output of the voltage-current conversion circuit 18, just setting the value of the resistor 182 to be low can reduce thermal noise and increase the signal-to-noise ratio.

While in the above-described embodiment, the RC filter circuits 12, 16 are inserted, one or both of them may be removed. Moreover, the differential operation circuit 14 only needs to be a circuit capable of subtracting the output signal OUT from the input signal IN, and is not limited to the exemplified circuit. Furthermore, the feedback circuit 183 only needs to be a circuit capable of generating the feedback voltage FB in accordance with the voltage applied to the resistor 182, and is not limited to the exemplified circuit.

While the embodiment of the present invention is described in the foregoing, the above-described embodiment is only an exemplification for carrying out the present invention. Thus, the present invention is not limited to the above-described embodiment, but various changes and modifications can be made herein without departing from the scope of the invention as defined in the appended claims.

What is claimed is:

1. A low-pass filter attenuating a high frequency component of an input signal and outputting a low frequency component of the input signal as an output signal, comprising:
    a differential operation circuit subtracting the output signal from the input signal and outputting a differential signal;
    a voltage-current conversion circuit converting a voltage of the differential signal outputted from the differential operation circuit into a current; and
    a capacitance accumulating charges in a current received from the voltage-current conversion circuit to generate the output signal,
    wherein the voltage-current conversion circuit including:
    a first operational amplifier having a noninverting input terminal connected to an input terminal of the voltage-current conversion circuit and an inverting input terminal receiving a feedback voltage;
    a first resistor connected between an output terminal of the voltage-current conversion circuit and an output terminal of the first operational amplifier; and
    a feedback unit for generating the feedback voltage in accordance with a voltage applied to the first resistor.

2. The lowpass filter according to claim 1, wherein the feedback unit includes:
    a second operational amplifier having an inverting input terminal connected to the output terminal of the voltagecurrent conversion circuit and an output terminal connected to the inverting input terminal of the first operational amplifier;

a second resistor connected between the output terminal of the first operational amplifier and a noninverting input terminal of the second operational amplifier;

a third resistor connected between the noninverting input terminal of the second operational amplifier and a ground; and a fourth resistor connected between the output terminal of the second operational amplifier and the inverting input terminal of the second operational amplifier.

3. The lowpass filter according to claim 2, wherein resistance values $R_1$ to $R_4$ of the first to fourth resistors are set so as to satisfy a relational expression of $R_1*R_3=R_2*R_4$.

4. The lowpass filter according to claims 1, further comprising:

a first filter circuit attenuating a high frequency component of the differential signal outputted from the differential operation circuit, and outputting a low frequency component of the differential signal to the voltage-current conversion circuit.

5. The lowpass filter according to claims 1, further comprising:

a second filter circuit attenuating a high frequency component of the input signal and outputting a low frequency component of the input signal to the differential operation circuit.

6. A voltage-current conversion circuit converting a voltage into a current, comprising:

a first operational amplifier having a noninverting input terminal connected to an input terminal of the voltage-current conversion circuit and an inverting input terminal receiving a feedback voltage;

a first resistor connected between an output terminal of the voltage-current conversion circuit and an output terminal of the first operational amplifier; and a feedback unit for generating the feedback voltage in accordance with a voltage applied to the first resistor, wherein the feedback unit includes a second operational amplifier having an inverting input terminal connected to the output terminal of the voltage-current conversion circuit and an output terminal connected to the inverting input terminal of the first operational amplifier;

a second resistor connected between the output terminal of the first operational amplifier and a noninverting input terminal of the second operational amplifier;

a third resistor connected between the noninverting input terminal of the second operational amplifier and a ground; and a fourth resistor connected between the output terminal of the second operational amplifier and the inverting input terminal of the second operational amplifier.

7. The voltagecurrent conversion circuit according to claim 6, wherein resistance values $R_1$ to $R_4$ of the first to fourth resistors are set so as to satisfy a relational expression of $R_1*R_3=R_2*R_4$.

* * * * *